(12) United States Patent
Wang et al.

(10) Patent No.: US 9,612,487 B2
(45) Date of Patent: Apr. 4, 2017

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Qiangtao Wang, Beijing (CN); Hyunsic Choi, Beijing (CN); Zheng Fang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 25 days.

(21) Appl. No.: 14/415,638

(22) PCT Filed: Apr. 15, 2014

(86) PCT No.: PCT/CN2014/075393
§ 371 (c)(1),
(2) Date: Jan. 19, 2015

(87) PCT Pub. No.: WO2015/089963
PCT Pub. Date: Jun. 25, 2015

(65) Prior Publication Data
US 2016/0018703 A1  Jan. 21, 2016

(30) Foreign Application Priority Data

Dec. 19, 2013 (CN) .......................... 2013 1 0706543

(51) Int. Cl.
*G02F 1/1343* (2006.01)
*G02F 1/1368* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS 6,717,638 B1 * 4/2004 Kim ................. G02F 1/133514
349/106
7,659,130 B2 * 2/2010 Rhee ................ G02F 1/136227
257/E21.411
(Continued)

FOREIGN PATENT DOCUMENTS

| CN | 1314608 A | 9/2001 |
|----|-----------|--------|
| CN | 101047198 A | 10/2007 |

(Continued)

OTHER PUBLICATIONS

First Office Action dated Sep. 21, 2015 corresponding to Chinese application No. 201310706543.0.
(Continued)

*Primary Examiner* — Abul Kalam
(74) *Attorney, Agent, or Firm* — Nath, Goldberg & Meyer; Joshua B. Goldberg; Leonid D. Thenor

(57) ABSTRACT

The present invention provides an array substrate, a manufacturing method thereof and a display device, relates to the field of liquid crystal display technology, and can solve the problem of low aperture ratio of the existing array substrate. The array substrate of the present invention comprises: a light filtering layer provided on a substrate a thin film transistor formed thereon, a planarization layer covering the light filtering layer, and a pixel electrode provided above the planarization layer, the array substrate further comprises: a third electrode layer connected to a drain of the thin film transistor and extending onto the light filtering layer; and a contacting via penetrating through the planarization layer and provided above a portion of the third electrode layer on
(Continued)

the light filtering layer, the pixel electrode being connected to the third electrode layer through the contacting via.

16 Claims, 2 Drawing Sheets

(51) Int. Cl.
    *G02F 1/1362*     (2006.01)
    *H01L 27/12*     (2006.01)
    *G02F 1/1333*     (2006.01)

(52) U.S. Cl.
    CPC .. *G02F 1/134363* (2013.01); *G02F 1/136209* (2013.01); *G02F 1/136227* (2013.01); *H01L 27/1248* (2013.01); *G02F 2001/133357* (2013.01); *G02F 2001/134372* (2013.01); *G02F 2001/136222* (2013.01); *G02F 2201/40* (2013.01)

(56) References Cited

U.S. PATENT DOCUMENTS

| | | | | |
|---|---|---|---|---|
| 9,252,268 B2* | 2/2016 | Kim | ................ | H01L 29/7831 |
| 2004/0119075 A1* | 6/2004 | Murade | ............... | H01L 27/1255 |
| | | | | 257/72 |
| 2005/0122442 A1* | 6/2005 | Park | ................ | G02F 1/136227 |
| | | | | 349/43 |
| 2009/0115947 A1 | 5/2009 | Huang et al. | | |
| 2010/0065848 A1 | 3/2010 | Lee et al. | | |
| 2011/0227850 A1* | 9/2011 | Oh | ................ | G02F 1/13338 |
| | | | | 345/173 |
| 2012/0268396 A1* | 10/2012 | Kim | ................ | G06F 3/0412 |
| | | | | 345/173 |
| 2013/0063673 A1* | 3/2013 | Choi | ................ | G02F 1/136227 |
| | | | | 349/43 |
| 2013/0300968 A1* | 11/2013 | Okajima | ........... | G02F 1/136209 |
| | | | | 349/43 |
| 2014/0054592 A1* | 2/2014 | Gu | ................ | G02F 1/134363 |
| | | | | 257/71 |
| 2014/0104527 A1* | 4/2014 | Yang | ................ | H01L 27/1225 |
| | | | | 349/43 |
| 2015/0200207 A1* | 7/2015 | Nozu | ................ | G02F 1/133502 |
| | | | | 257/71 |
| 2015/0380442 A1* | 12/2015 | Li | ................ | H01L 27/1214 |
| | | | | 257/72 |

FOREIGN PATENT DOCUMENTS

| | | |
|---|---|---|
| CN | 101794047 A | 8/2010 |
| CN | 101943811 A | 1/2011 |
| CN | 102681276 A | 9/2012 |
| CN | 103246106 A | 8/2013 |
| CN | 103700669 A | 4/2014 |
| CN | 203688950 U | 7/2014 |

OTHER PUBLICATIONS

Search Report issued in International Application No. PCT/CN2014/075393, thirteen (13) pages.

* cited by examiner

US 9,612,487 B2

ARRAY SUBSTRATE, MANUFACTURING METHOD THEREOF AND DISPLAY DEVICE

This is a National Phase Application filed under 35 U.S.C. 371 as a national stage of PCT/CN2014/075393, filed Apr. 15, 2014, and claims priority benefit from Chinese Application No. 201310706543.0, filed Dec. 19, 2013, the content of each of which is hereby incorporated by reference in its entirety.

FIELD OF THE INVENTION

The present invention relates to the field of liquid crystal display technology, and particularly to an array substrate, a manufacturing method thereof and a display device.

BACKGROUND OF THE INVENTION

With the development in technology and process of thin film transistors of flat panel display devices, liquid crystal panels are developing to have high resolution and high definition. FIG. 1 is a structure of color filter (comprising a color filter 107 and a black matrix 106) on Array (COA), i.e., a COA array substrate, and since there is no problem of light leak due to substrates alignment, width of the black matrix 106 can be effectively reduced, thus increasing aperture ratio of a pixel and further improving transmittance of the panel. When COA technology is combined with Advanced Super Dimension Switch liquid crystal display technology which mainly depends on in-plane rotation of liquid crystal molecules, light leak in an oblique direction can be effectively prevented, and further occurrence of color mixing can be avoided. Thus, this technology has become one of the competitive technologies in high-definition products.

As shown in FIG. 1, generally, a basic structure of a COA array substrate includes a pattern including a thin film transistor formed on a substrate 101, wherein the thin film transistor may be of top-gate type or bottom-gate type, and a bottom-gate type thin film transistor is taken as an example here. The thin film transistor specifically includes: a gate 102, a gate insulating layer 103 covering the gate 102, an active region 104 provided on the gate insulating layer 103 and source and drain 105, and the source and drain 105 are connected to the active region 104. A light filtering layer 107 is provided on the substrate 101 on which the thin film transistor has been formed; a planarization layer 108 is provided on the light filtering layer to eliminate level difference; then a first electrode layer (common electrode) 110, a passivation layer 111 (PVX) and a second electrode layer (pixel electrode) 112 are sequentially provided, wherein the second electrode layer (pixel electrode) 112 is connected to the drain 105 of the thin film transistor through a contacting via 109 penetrating through the passivation layer 111, the first electrode layer (common electrode) 110, the planarization layer 108 and the light filtering layer. In this case, since at the contacting via 109, liquid crystals may be irregularly arranged and thus light leak may occur, the drain 105 needs to be lengthened, so as to avoid light leak. However, an increase in the length of the drain 105 will result in decreased aperture ratio and increased power consumption of the product. Moreover, since the contacting via 109 is relatively deep, and its opening at the top is relatively large, the aperture ratio of the COA array substrate is further affected. Further, the relatively deep contacting via 109 may likely lead to disconnection, which results in that the pixel electrode is disconnected with the drain and the pixel cannot be charged.

SUMMARY OF THE INVENTION

Technical problem to be solved by the present invention includes providing an array substrate having an improved aperture ratio, a manufacturing method thereof and a display device, in view of the above defects in the existing array substrates.

To solve the above technical problem, the present invention provides an array substrate, which comprises: a light filtering layer provided on a substrate with a thin film transistor formed thereon, a planarization layer covering the light filtering layer, and a pixel electrode provided above the planarization layer, the array substrate further comprises: a third electrode layer connected to a drain of the thin film transistor and extending onto the light filtering layer; and a contacting via penetrating through the planarization layer and provided above a portion of the third electrode layer on the light filtering layer, the pixel electrode being connected to the third electrode layer through the contacting via.

The drain of the array substrate of the present invention is electrically connected to the pixel electrode through the third electrode layer connected to the drain and extending onto the light filtering layer, the contacting via penetrating through the planarization layer is provided above a portion of the third electrode layer on the light filtering layer, and the pixel electrode is connected to the third electrode layer through the contacting via. Since the contacting via of the present invention, compared to the contacting via for connecting the drain to the pixel electrode in the prior art, obviously has a smaller opening, and the drain does not need to be lengthened, the aperture ratio is apparently improved.

Preferably, the light filtering layer comprises a color filter and a black matrix, the pixel electrode is positioned above the color filter, the black matrix is at least positioned above the thin film transistor, the color filter and the black matrix are provided alternately on the substrate, and the third electrode layer extends onto the color filter or extends onto the black matrix.

Preferably, the array substrate further comprises a passivation layer and a common electrode sequentially provided on the pixel electrode.

Alternatively, the array substrate further comprises a passivation layer and a common electrode provided between the pixel electrode and the planarization layer, the common electrode and the passivation layer are sequentially provided on the planarization layer and the contacting via penetrates through the planarization layer and the passivation layer.

Further preferably, materials of the pixel electrode and the common electrode are indium tin oxide.

To solve the technical problem of the present invention, the present invention further provides a manufacturing method of the above array substrate, which comprises steps of:

forming, on a substrate with a thin film transistor formed thereon, a pattern including a light filtering layer through a patterning process;

forming, on the substrate subjected to the above step, a third electrode layer connected to a drain of the thin film transistor and extending onto the lightfiltering layer through a patterning process;

forming, on the substrate subjected to the above steps, a planarization layer, and forming a contacting via penetrating through the planarization layer above a portion of the third electrode layer on the light filtering layer; and forming, on the substrate subjected to the above steps, a pattern including a pixel electrode through a patterning process, wherein the pixel electrode is connected to the third electrode layer through the contacting via penetrating through the planarization layer.

Preferably, the light filtering layer comprises a color filter and a black matrix, the pixel electrode is formed above a the color filter, the black matrix is at least formed above the thin film transistor, the color filter and the black matrix are provided alternately on the substrate, and the third electrode layer extends onto the color filter or extends onto the black matrix.

Preferably, the manufacturing method further comprises steps of:

forming a passivation layer on the pixel electrode; and forming, on the passivation layer, a pattern including a common electrode through a patterning process.

Alternatively, after forming the planarization layer and before forming, above a portion of the third electrode layer on the light filtering layer, the contacting via penetrating through the planarization layer, the manufacturing method further comprises steps of:

forming, on the planarization layer, a pattern including a common electrode through a patterning process; and forming a passivation layer on the common electrode, wherein the contacting via penetrating through the planarization layer and formed above a portion of the third electrode layer on the light filtering layer also penetrates through the passivation layer.

The manufacturing method of the array substrate of the present invention is simple and is easy to implement.

A technical solution used to solve the technical problem of the present invention is a display device, which comprises the above array substrate.

As the display device of the present invention includes the above array substrate, its aperture ratio is increased.

DETAILED DESCRIPTION OF THE EMBODIMENTS

To enable those skilled in the art to better understand the technical solutions of the present invention, the present invention will be further described in detail below in conjunction with the accompanying drawings and the specific implementations.

Embodiment 1

Figure 2:
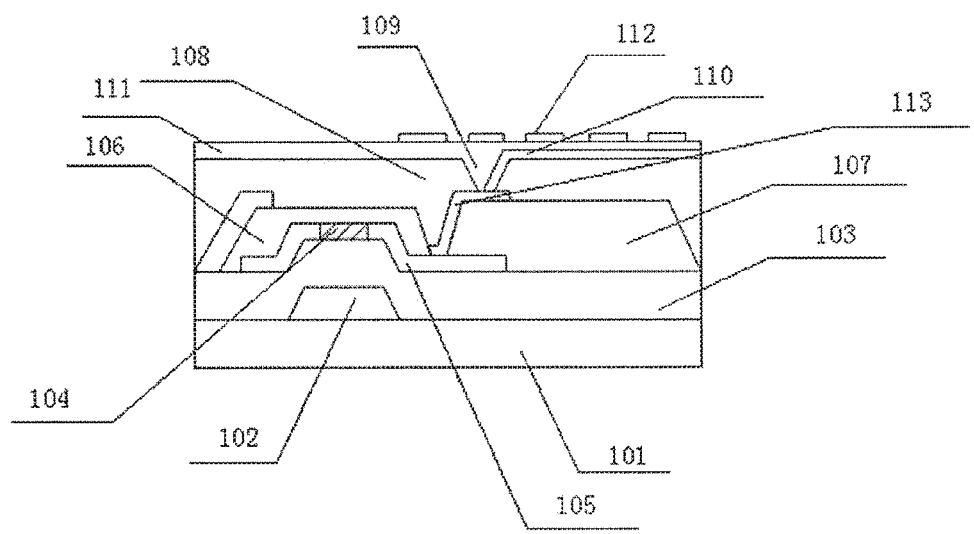
FIG. 2 is a schematic diagram of a structure of an array substrate according to an embodiment of the present invention.
Figure 3:
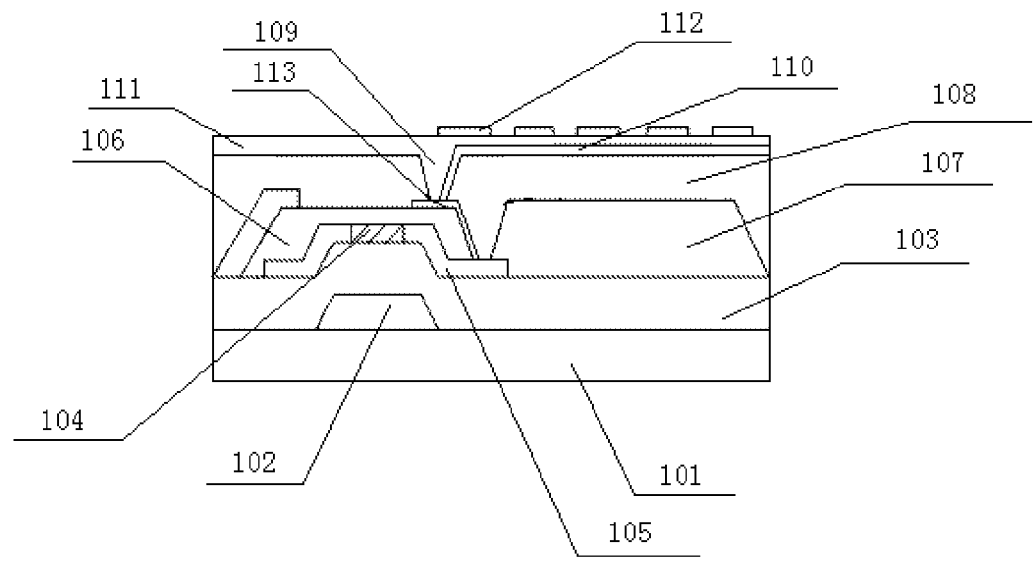
FIG. 3 is a schematic diagram of a structure of another array substrate according to an embodiment of the present invention.
Figure 4:
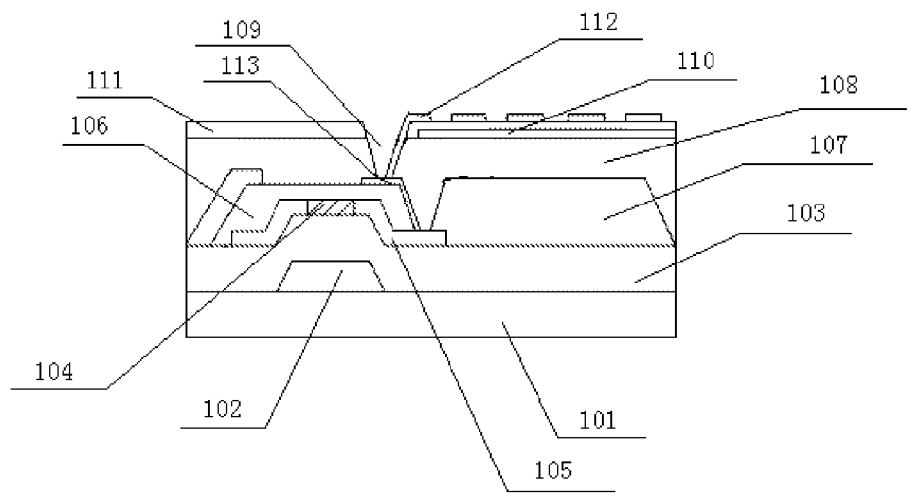
FIG. 4 is a schematic diagram of a structure of still another array substrate according to an embodiment of the present invention.

As shown in FIGS. 2 to 4, the present embodiment provides an array substrate, which comprises a thin film transistor provided on a substrate 101. It should be noted that the thin film transistor may be of top-gate type or bottom-gate type, and a bottom-gate type thin film transistor is taken as an example here. The thin film transistor specifically comprises: a gate 102, a gate insulating layer 103 covering the gate 102, an active region 104 provided on the gate insulating layer 103, and source and drain 105 connected to the active region 104. The array substrate further comprises a light filtering layer (comprising a color filter and a black matrix) provided on the substrate 101 with the thin film transistor formed thereon, a planarization layer 108 covering the light filtering layer, a pixel electrode provided on the planarization layer 108, and a third electrode layer 113 connected to the drain 105 of the thin film transistor and extending onto the light filtering layer (at least covering a portion of the light filtering layer). Preferably, one end of the third electrode layer 113 is connected to the drain 105 of the thin film transistor and the other end thereof extends onto an upper surface of the light filtering layer. Here, a contacting via 109 penetrating through the planarization layer 108 is provided above a portion of the third electrode layer 113 on the light filtering layer, and the pixel electrode is connected to the third electrode layer 113 through the contacting via 109 and is then connected to the drain 105 of the thin film transistor.

The drain 105 of the thin film transistor on the array substrate of the present embodiment is connected to the pixel electrode through the third electrode layer 113 extending onto the light filtering layer, without lengthening the length of the drain 105, and therefore, the aperture ratio of the array substrate will not be affected. In particular, as the third electrode layer 113 extends onto a portion of the light filtering layer, only a contacting via 109 that penetrates through the planarization layer 108 above a portion of the third electrode layer 113 on the light filtering layer needs to be formed. The contacting via 109, compared to the contacting via in the prior art, has a shallower depth and a narrower opening width, and as a result, compared to an existing array substrate, the array substrate provided by the present embodiment has an apparently improved aperture ratio.

As shown in FIGS. 2 to 4, the second electrode layer 112 is provided above the first electrode layer 110 and is spaced apart from the first electrode layer 110 by the passivation layer 111. Of the first electrode layer 110 and the second electrode layer 112, the electrode that is connected to the drain 105 of the thin film transistor through the third electrode layer 113 is the pixel electrode, and the other electrode is the common electrode. Specific description is given below.

Figure 1:
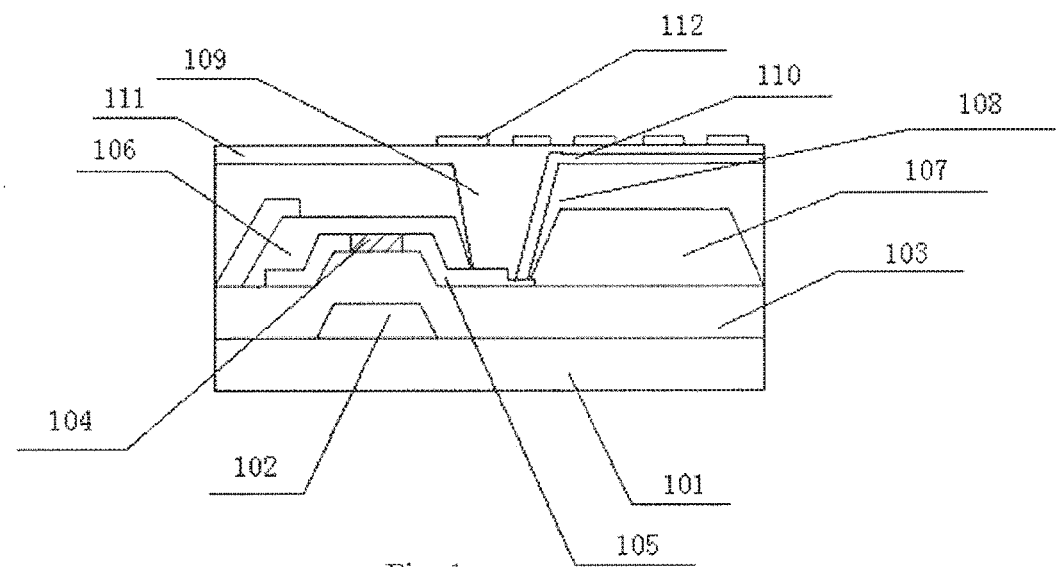
FIG. 1 is a schematic diagram of a structure of an array substrate of the prior art.

As shown in FIG. 2, as a case of the present embodiment, preferably, the third electrode layer 113 extends onto the color filter 107 (e.g., red filter, green filter, blue filter) (covering a portion of the color filter 107), and the first electrode layer 110 is positioned above the color filter 107. In this case, a contacting via 109 penetrating through the planarization layer 108 is formed above a portion of the third electrode layer 113 on the color filter 107, so that the third electrode layer 113 is connected to the first electrode layer 110. In this case, the drain 105 of the thin film transistor does not need to be lengthened, depth and opening width of the contacting via 109 penetrating through the planarization layer 108 are smaller than those of the contacting via of the existing array substrate shown in FIG. 1, and therefore, the aperture ratio of the array substrate of the present embodiment can be apparently improved.

Alternatively, as shown in FIG. 3, preferably, the third electrode layer 113 may extend onto the black matrix 106 (covering a portion of the black matrix 106), and the black matrix 106 covers the thin film transistor (the black matrix 106 is used for avoiding light leak in an area where the thin film transistor is positioned). In this case, a contacting via 109 penetrating through the planarization layer 108 is formed above a portion of the third electrode layer 113 on the black matrix 106, so that the third electrode layer 113 is connected to the first electrode layer 110. Since the black matrix 106 is provided above the thin film transistor, the contacting via 109 is provided above the black matrix 106, and obviously, the depth and opening width of the contacting via 109 are smaller than those of the contacting via of the existing array substrate shown in FIG. 1, and therefore, the aperture ratio of the array substrate of the present embodiment is apparently improved.

It should be noted that, in the above array substrate shown in FIG. 2 or 3, the first electrode layer 110 is pixel electrode, the pixel electrode is provided on the planarization layer 108, further, the passivation layer 111 and the second electrode layer 112 are sequentially formed on the pixel electrode, the second electrode layer 112 is common electrode, and the pixel electrode (the first electrode layer 110) is connected to the third electrode layer 113 through the contacting via 109 and is thus connected to the drain 105 of the thin film transistor.

Alternatively, as shown in FIG. 4, the first electrode layer 110 may be common electrode, the second electrode layer 112 may be pixel electrode, the common electrode is provided on the planarization layer 108, further, the passivation layer 111 and the pixel electrode are sequentially formed on the common electrode, the pixel electrode is connected to the third electrode layer 113 through the contacting via 109 and is thus connected to the drain 105 of the thin film transistor. In this case, the contacting via 109 penetrates through both the planarization layer 108 and the passivation layer 111.

In addition, in the case of FIG. 4, the third electrode layer 113 may extend onto the color filter 107, and other structures are similar to those shown in FIG. 4. That is, the pixel electrode is connected to the third electrode layer 113 through the contacting via 109 penetrating through both the planarization layer 108 and the passivation layer 111, and is thus connected to the drain 105 of the thin film transistor.

In the present embodiment, the first electrode layer 110 is a plate-shaped electrode, or may be a strip-shaped electrode; the second electrode layer 112 above the first electrode layer 110 is a strip-shaped electrode. According to electric field direction, an ADS mode liquid crystal display is adopted in this case. Needless to say, liquid crystal display of other mode may also be adopted. Further preferably, materials of the pixel electrode and the common electrode are both indium tin oxide, and of course other transparent conductive material can also be adopted.

Embodiment 2

The present embodiment provides a manufacturing method of an array substrate, which comprises steps as below.

At step 1, a pattern including a thin film transistor is formed through a patterning process on a substrate 101, wherein, the thin film transistor is of top-gate type or bottom-gate type. Here, description is given by taking a case that a bottom-gate type thin film transistor is manufactured as an example. Specifically, a gate is formed on the substrate 101 through processes such as sputtering, exposure, development, etching, stripping and the like, a gate insulating layer 103 is formed on the gate 102 through Plasma Enhanced Chemical Vapor Deposition or the like, an active region 104 is formed on the gate insulating layer 103 through processes such as sputtering, exposure, development, etching, stripping and the like, and source and drain 105, which are connected to the active region 104, are formed on the active region 104 through processes such as sputtering, exposure, development, etching, stripping and the like.

Here, the gate 102 may be a single layer or a laminated film with multiple layers formed from one or more materials selected from molybdenum (Mo), molybdenum-niobium alloy (MoNb), aluminum (Al), neodymium-aluminum alloy (AlNd), titanium (Ti) and Copper (Cu), and preferably is a signal layer or a laminated film with multiple layers formed from Mo, Al or an alloy containing Mo and/or Al, and the gate 102 has a thickness of 100 nm~500 nm.

In the present embodiment, the gate insulating layer 103 may be a laminated film with multiple layers formed from one or two materials selected from silicon oxide (SiOx), silicon nitride (SiNx), hafnium oxide (HfOx), silicon oxynitride (SiON), aluminum oxide (AlOx) and the like. Thickness of the gate insulating layer 103 is controlled to be within 100~600 nm, and may be adjusted according to actual condition.

The active region 104 may be formed from a film containing In (indium), Ga (gallium), Zn (zinc), O (oxygen) Sn (tin), etc. through sputtering, and the film must contain oxygen and two or more other elements, for example, indium gallium zinc oxide (IGZO), indium zinc oxide (IZO), indium tin oxide (InSnO), indium gallium tin oxide (InGaSnO), etc. Material of the oxide semiconductor active layer preferably is IGZO or IZO, and thickness thereof preferably is controlled be to within 10~100 nm.

The source and drain 105 may be a single layer or a laminated film with multiple layers formed from one or more materials selected from molybdenum (Mo), molybdenum-niobium alloy (MoNb), aluminum (Al), neodymium-aluminum alloy (AlNd), titanium (Ti) and Copper (Cu), and preferably is a signal layer or a laminated film with multiple layers formed from Mo, Al or an alloy containing Mo and/or Al.

At step 2, on the substrate 101 subjected to the above step, a pattern including a light filtering layer is formed through a patterning process. Here, the light filtering layer comprises a color filter 107 and a black matrix 106. Specifically, on the substrate 101 on which the thin film transistor has been formed, the black matrix (BM) 106 is formed through processes such as coating, exposure, development, baking and the like, and on the substrate 101 on which the black matrix 106 has been formed, the color filter 107, i.e., color filters 107 of a red, green or blue (RGB) sub-pixel for example, is formed through processes such as coating, exposure, development, baking and the like. In the array substrate, the black matrices 106 and the color filters 107 are provided alternately.

At step 3, on the substrate 101 subjected to the above steps, a third electrode layer 113 connected to the drain 105 of the thin film transistor and extending onto the light filtering layer is formed through processes such as sputtering, exposure, development, etching, stripping and the like. In this case, the third electrode layer 113 preferably extends onto the color filter 107, or may extend onto the black matrix 106. Specifically, one end of the third electrode layer 113 is connected to the drain 105 of the thin film transistor, and the other end thereof extends onto the color filter 107 or the black matrix 106, and preferably onto an upper surface of the color filter 107 or the black matrix 106. The third electrode layer 113 preferably adopts a conductive material, and generally adopts a metal material, such as copper, aluminium, silver, etc. In a case that the third electrode layer 113 adopts a metal material and said other end thereof extends onto the upper surface of the color filter 107, on the premise that good electrical connection between the third electrode layer 113 and the pixel electrode can be guaranteed, projection of the third electrode layer 113 on the substrate 101 may be as small as possible, and preferably within the projection of the drain 105 of the thin film transistor on the substrate 101, so as to reduce influence on the aperture ratio. At step 4, on the substrate 101 subjected to the above steps, a planarization layer 108 is formed to eliminate level difference between color filters 107 of different colors and black matrices 106. Here, material of the planarization layer 108 is generally silicon dioxide, silicon nitride, aluminum oxide, etc.

At step 5, on the substrate 101 subjected to the above steps, a contacting via 109 penetrating through the planarization layer 108 is formed above a portion of the third electrode layer 113 on the light filtering layer. Here, if the third electrode layer 113 extends onto the color filter 107, the contacting via 109 penetrating through the planarization layer 108 is formed above a portion of the third electrode layer 113 on the color filter 107 accordingly; if the third electrode layer 113 extends onto the black matrix 106, the contacting via 109 penetrating through the planarization layer 108 is formed above a portion of the third electrode layer 113 on the black matrix 106 accordingly.

At step 6, on the substrate 101 subjected to the above steps, a pattern including a pixel electrode is formed through a patterning process, and the pixel electrode is connected to the third electrode layer 113 through the contacting via 109. Here, material of the pixel electrode is preferably indium tin oxide, and of course may also be other transparent conductive material.

At step 7, on the substrate 101 subjected to the above steps, a passivation layer 111 is formed. Here, material of the passivation layer 111 is generally silicon dioxide, silicon nitride, aluminum oxide, etc.

At step 8, on the substrate 101 subjected to the above steps, a pattern including a common electrode is formed through a patterning process. Here, material of the common electrode is preferably indium tin oxide, and of course may also be other transparent conductive material. Thus, the array substrate shown in FIG. 2 or 3 is formed.

It should be noted that, in the above, the pixel electrode is the first electrode layer 110 and the common electrode is the second electrode layer 112 shown in FIG. 2 or 3.

The drain 105 of the thin film transistor on the array substrate manufactured by using the method provided by the present embodiment is electrically connected to the pixel electrode 110 through the third electrode layer 113 extending onto the light filtering layer, without lengthening the length of the drain 105, and therefore, the aperture ratio of the array substrate will not be affected. In particular, as the third electrode layer 113 extends onto the light filtering layer, only a contacting via 109 that penetrates through the planarization layer 108 on a portion of the third electrode layer 113 on the light filtering layer needs to be formed. The contacting via 109, compared to the contacting via in the prior art, obviously has a shallower depth and a narrower opening width, and as a result, compared to an existing array substrate, the array substrate provided by the present embodiment has an apparently improved aperture ratio.

Those skilled in the art can understand that, after the array substrate is manufactured, a liquid crystal layer is formed by using a liquid crystal pouring (dropping) device, and then the array substrate is assembled with an opposite substrate (color filter substrate). Detailed description regarding these known operations is omitted herein.

Embodiment 3

The present embodiment provides a manufacturing method of an array substrate, this method and the method in Embodiment 2 are similar, and only differ in that a pattern including the common electrode is formed through a patterning process after sequentially forming a thin film transistor, a light filtering layer and a planarization layer 108 on the substrate. After the common electrode is formed, the method further includes steps as below.

A passivation layer 111 is formed on the common electrode, and a contacting via 109 penetrating through the passivation layer 111 and the planarization layer 108 are formed above a portion of the third electrode layer 113 on the light filtering layer. If the third electrode layer 113 extends onto the color filter 107, the contacting via 109 penetrating through the passivation layer 111 and the planarization layer 108 is formed above a portion of the third electrode layer 113 on the color filter 107 accordingly; if the third electrode layer 113 extends onto the black matrix 106, the contacting via 109 penetrating through the passivation layer 111 and the planarization layer 108 is formed above a portion of the third electrode layer 113 on the black matrix 106 accordingly.

On the substrate subjected to the above steps, a pattern including a pixel electrode is formed through a patterning process, wherein a portion of the third electrode layer 113 is exposed by the contacting via 109 formed in the above step, as shown in FIG. 4. In this case, the pixel electrode is the second electrode layer 112 and the common electrode is the first electrode layer 110.

Embodiment 4

The present embodiment provides a display device, which comprises the array substrate described in Embodiment 1.

The display device may be any product or component with a display function, such as a mobile phone, a tablet computer, a television, a display, a notebook computer, a digital photo frame, a navigator or the like.

The display device of the present embodiment comprises the array substrate in Embodiment 1, and therefore has better aperture ratio and better visual effect.

Needless to say, the display device of the present embodiment may also comprise other conventional structures, such as backlight, power unit, display driving unit and the like, which are not elaborated herein.

It can be understood that, the above implementations are merely exemplary implementations for explaining the principle of the present invention, but the present invention is not limited thereto. For those skilled in the art, various variations and improvements may be made without departing from the spirit and essence of the present invention, and these variations and improvements are also deemed as the protection scope of the present invention.

The invention claimed is:

1. An array substrate, comprising: a light filtering layer provided on a substrate on which a thin film transistor is formed, a planarization layer covering the light filtering layer, and a pixel electrode provided above the planarization layer, wherein the array substrate further comprises: a third electrode layer connected to a drain of the thin film transistor and extending onto the light filtering layer; and a contacting via penetrating through the planarization layer and provided above the third electrode layer, the pixel electrode being connected to the third electrode layer through the contacting via, and wherein projection of the third electrode layer on the substrate is within projection of the drain of the thin film transistor on the substrate.

2. The array substrate according to claim 1, wherein the light filtering layer comprises a color filter and a black matrix, the pixel electrode is positioned above the color filter, the black matrix is at least positioned above the thin film transistor, the color filter and the black matrix are provided alternately on the substrate, and the third electrode layer extends onto the color filter, or the third electrode layer extends onto the black matrix.

3. The array substrate according to claim 2, further comprising: a passivation layer and a common electrode sequentially provided on the pixel electrode.

4. The array substrate according to claim 2, further comprising: a passivation layer and a common electrode provided between the pixel electrode and the planarization layer, wherein, the common electrode and the passivation layer are sequentially provided on the planarization layer and the contacting via penetrates through the planarization layer and the passivation layer.

5. The array substrate according to claim 3, wherein, materials of the pixel electrode and the common electrode are indium tin oxide.

6. The array substrate according to claim 4, wherein, materials of the pixel electrode and the common electrode are indium tin oxide.

7. A manufacturing method of an array substrate, comprising steps of:

forming, on a substrate on which a thin film transistor is formed, a pattern including a light filtering layer through a patterning process;

forming, on the substrate subjected to the above step, a third electrode layer connected to a drain of the thin film transistor and extending onto the light filtering layer through a patterning process such that projection of the third electrode layer on the substrate is within projection of the drain of the thin film transistor on the substrate;

forming, on the substrate subjected to the above steps, a planarization layer, and forming a contacting via penetrating through the planarization layer above a portion of the third electrode layer on the light filtering layer; and forming, on the substrate subjected to the above steps, a pattern including a pixel electrode through a patterning process, wherein the pixel electrode is connected to the third electrode layer through the contacting via penetrating through the planarization layer.

8. The manufacturing method of an array substrate according to claim 7, wherein the light filtering layer comprises a color filter and a black matrix, the pixel electrode is formed above the color filter, the black matrix is at least formed above the thin film transistor, the color filter and the black matrix are provided alternately on the substrate, and the third electrode layer extends onto the color filter, or the third electrode layer extends onto the black matrix.

9. The manufacturing method of an array substrate according to claim 8, further comprising steps of:

forming a passivation layer on the pixel electrode; and forming, on the passivation layer, a pattern including a common electrode through a patterning process.

10. The manufacturing method of an array substrate according to claim 8, wherein after forming the planarization layer and before forming, above a portion of the third electrode layer on the light filtering layer, the contacting via penetrating through the planarization layer, the manufacturing method further comprises steps of:

forming, on the planarization layer, a pattern including a common electrode through a patterning process; and forming a passivation layer on the common electrode, wherein the contacting via penetrating through the planarization layer and formed above a portion of the third electrode layer on the light filtering layer also penetrates through the passivation layer.

11. A display device, comprising an array substrate, wherein the array substrate comprises: a light filtering layer provided on a substrate on which a thin film transistor is formed, a planarization layer covering the light filtering layer, and a pixel electrode provided above the planarization layer, wherein, the array substrate further comprises: a third electrode layer connected to a drain of the thin film transistor and extending onto the light filtering layer; and a contacting via penetrating through the planarization layer and provided above the third electrode layer, the pixel electrode being connected to the third electrode layer through the contacting via, and wherein projection of the third electrode layer on the substrate is within projection of the drain of the thin film transistor on the substrate.

12. The display device according to claim 11, wherein the light filtering layer comprises a color filter and a black matrix, the pixel electrode is positioned above the color filter, the black matrix is at least positioned above the thin film transistor, the color filter and the black matrix are provided alternately on the substrate, and the third electrode layer extends onto the color filter, or the third electrode layer extends onto the black matrix.

13. The display device according to claim 12, further comprising: a passivation layer and a common electrode sequentially provided on the pixel electrode.

14. The display device according to claim 12, further comprising: a passivation layer and a common electrode provided between the pixel electrode and the planarization layer, wherein, the common electrode and the passivation layer are sequentially provided on the planarization layer and the contacting via penetrates through the planarization layer and the passivation layer.

15. The display device according to claim 13, wherein, materials of the pixel electrode and the common electrode are indium tin oxide.

16. The display device according to claim 14, wherein, materials of the pixel electrode and the common electrode are indium tin oxide.

* * * * *